US008629065B2

(12) United States Patent
Spiberg et al.

(10) Patent No.: US 8,629,065 B2
(45) Date of Patent: *Jan. 14, 2014

(54) GROWTH OF PLANAR NON-POLAR {10-10} M-PLANE GALLIUM NITRIDE WITH HYDRIDE VAPOR PHASE EPITAXY (HVPE)

(75) Inventors: Philippe Spiberg, Laguna Beach, CA (US); Hussein S. El-Ghoroury, Carlsbad, CA (US); Alexander Usikov, Rockville, MD (US); Alexander Syrkin, Montgomery Village, MD (US); Bernard Scanlan, Annapolis, MD (US); Vitali Soukhoveev, Gaithersburg, MD (US)

(73) Assignee: Ostendo Technologies, Inc., Carlsbad, CA (US)

( * ) Notice: Subject to any disclaimer, the term of this patent is extended or adjusted under 35 U.S.C. 154(b) by 57 days.

This patent is subject to a terminal disclaimer.

(21) Appl. No.: 12/614,313

(22) Filed: Nov. 6, 2009

(65) Prior Publication Data

US 2011/0108954 A1  May 12, 2011

(51) Int. Cl.
*H01L 31/036* (2006.01)

(52) U.S. Cl.
USPC .............. 438/698; 438/478; 257/76; 257/627

(58) Field of Classification Search
USPC .............................. 438/698, 478; 257/76, 267
See application file for complete search history.

(56) References Cited

U.S. PATENT DOCUMENTS

| 5,923,950 | A | 7/1999 | Ishibashi et al. |
| 6,045,626 | A | 4/2000 | Yano et al. |
| 6,064,078 | A | 5/2000 | Northrup et al. |
| 6,069,021 | A | 5/2000 | Terashima et al. |
| 6,072,197 | A | 6/2000 | Horino et al. |
| 6,156,581 | A | 12/2000 | Vaudo et al. |
| 6,201,262 | B1 | 3/2001 | Edmond et al. |
| 6,218,269 | B1 | 4/2001 | Nikolaev et al. |
| 6,440,823 | B1 | 8/2002 | Vaudo et al. |

(Continued)

FOREIGN PATENT DOCUMENTS

| CN | 101138091 | 3/2008 |
| EP | 1385196 | 1/2004 |

(Continued)

OTHER PUBLICATIONS

Armitage, R., et al., "M-plane GaN grown on m-sapphire by metalorganic vapor phase epitaxy", *Applied Physics Letters*, vol. 92. (2008), pp. 092121-1 to 092121-3.

(Continued)

*Primary Examiner* — Howard Weiss
*Assistant Examiner* — Tifney Skyles
(74) *Attorney, Agent, or Firm* — Blakely Sokoloff Taylor & Zafman LLP (57) ABSTRACT

A method of growing planar non-polar m-plane III-Nitride material, such as an m-plane gallium nitride (GaN) epitaxial layer, wherein the III-Nitride material is grown on a suitable substrate, such as an m-plane Sapphire substrate, using hydride vapor phase epitaxy (HVPE). The method includes in-situ pretreatment of the substrate at elevated temperatures in the ambient of ammonia and argon, growing an intermediate layer such as an aluminum nitride (AlN) or aluminum-gallium nitride (AlGaN) on the annealed substrate, and growing the non-polar m-plane III-Nitride epitaxial layer on the intermediate layer using HVPE. Various alternative methods are disclosed.

1 Claim, 5 Drawing Sheets

(56) References Cited

U.S. PATENT DOCUMENTS

| | | | |
|---|---|---|---|
| 6,468,882 B2 | 10/2002 | Motoki et al. | |
| 6,573,164 B2 | 6/2003 | Tsvetkov et al. | |
| 6,613,143 B1 | 9/2003 | Melnik et al. | |
| 6,616,757 B1 | 9/2003 | Melnik et al. | |
| 6,627,552 B1 | 9/2003 | Nishio et al. | |
| 6,656,272 B2 | 12/2003 | Tsvetkov et al. | |
| 6,656,285 B1 | 12/2003 | Melnik et al. | |
| 6,660,083 B2 | 12/2003 | Tsvetkov et al. | |
| 6,706,119 B2 | 3/2004 | Tsvetkov et al. | |
| 6,890,809 B2 | 5/2005 | Karpov et al. | |
| 6,936,357 B2 | 8/2005 | Melnik et al. | |
| 7,091,514 B2 | 8/2006 | Craven et al. | |
| 7,220,324 B2 | 5/2007 | Baker et al. | |
| 7,220,658 B2 | 5/2007 | Haskell et al. | |
| 7,279,047 B2 | 10/2007 | Melnik et al. | |
| 7,338,828 B2 | 3/2008 | Imer et al. | |
| 7,361,576 B2 | 4/2008 | Imer et al. | |
| 7,427,555 B2 | 9/2008 | Haskell et al. | |
| 7,501,023 B2 | 3/2009 | Dmitriev et al. | |
| 7,575,947 B2 | 8/2009 | Iza | |
| 7,611,586 B2 | 11/2009 | Melnik et al. | |
| 7,670,435 B2 | 3/2010 | Tsvetkov et al. | |
| 7,687,293 B2 | 3/2010 | Sato et al. | |
| 7,691,658 B2 | 4/2010 | Kaeding et al. | |
| 7,704,331 B2 | 4/2010 | Baker et al. | |
| 7,727,333 B1 | 6/2010 | Syrkin et al. | |
| 7,846,757 B2 | 12/2010 | Farrell, Jr. et al. | |
| 7,858,996 B2 | 12/2010 | Zhong et al. | |
| 8,404,042 B2 | 3/2013 | Mizuhara et al. | |
| 2002/0074552 A1 | 6/2002 | Weeks, Jr. et al. | |
| 2002/0085603 A1* | 7/2002 | Okumura | 372/45 |
| 2002/0187356 A1 | 12/2002 | Weeks, Jr. et al. | |
| 2003/0198837 A1 | 10/2003 | Craven et al. | |
| 2004/0094773 A1 | 5/2004 | Kiyoku et al. | |
| 2004/0251471 A1 | 12/2004 | Dwilinski et al. | |
| 2004/0261692 A1 | 12/2004 | Dwilinski et al. | |
| 2005/0205884 A1 | 9/2005 | Kim et al. | |
| 2005/0245095 A1 | 11/2005 | Haskell et al. | |
| 2006/0138431 A1 | 6/2006 | Dwilinski et al. | |
| 2006/0205199 A1 | 9/2006 | Baker et al. | |
| 2006/0270087 A1 | 11/2006 | Imer et al. | |
| 2007/0015345 A1 | 1/2007 | Baker et al. | |
| 2007/0093073 A1 | 4/2007 | Farrell, Jr. et al. | |
| 2007/0111531 A1 | 5/2007 | Baker et al. | |
| 2007/0218655 A1 | 9/2007 | Sato et al. | |
| 2009/0197118 A1* | 8/2009 | Nagai et al. | 428/698 |

FOREIGN PATENT DOCUMENTS

| | | |
|---|---|---|
| EP | 1993150 | 11/2008 |
| JP | 2001-342100 | 12/2001 |
| JP | 2008-143772 | 6/2008 |
| TW | 200741822 | 11/2007 |
| WO | WO-03/089694 | 10/2003 |
| WO | WO-2006/099138 | 9/2006 |
| WO | WO-2007/084782 | 7/2007 |
| WO | WO-2008/059875 | 5/2008 |
| WO | WO-2010/009325 | 1/2010 |

OTHER PUBLICATIONS

Haskell, Benjamin A., et al., "Microstructure and Enhanced Morphology of Planar Nonpolar m-Plane GaN Grown by Hydride Vapor Phase Epitaxy" *Journal of Electronic Materials*, vol. 34, No. 4, (2005), pp. 357-360.

Sasaki, Hitoshi, et al., "Effect of aluminum carbide buffer layer on growth and self-separation of m-plane GaN by hydride vapor phase epitaxy", *Phys. Status Solidi A 206*, No. 6, (2009), pp. 1160-1163.

Wei, Tongbo, et al., "Microstructure and Optical Properties of Nonpolar m-Plane GaN Films Grown on m-Plane Sapphire by Hydride Vapor Phase Epitaxy", *The Japan Society of Applied Physics*, vol. 47, No. 5, (2008), pp. 3346-3349.

Zhu, Tiankai, et al., "M-Plane GaN Grown on m-Plane Sapphire by Hydride Vapor Phase Epitaxy", *Japanese Journal of Applied Physics*, vol. 48, (2009), 3 pages Total.

"International Search Report and Written Opinion of the International Searching Authority Dated Feb. 10, 2011" *International Application No. PCT/US2010/055324*.

Usikov, A., et al., "New results on HVPE growth of AlN, GaN, InN and their alloys", *Physica Status Solidi C 5*, No. 6, (2008), pp. 1825-1828.

Amano, H., et al., "Metalorganic vapor phase epitaxial growth of a high quality GaN film using an AlN buffer layer", *Applied Physics Letters*, vol. 48, No. 5, (Feb. 3, 1986), pp. 353-355.

Amano, Hiroshi, et al., "Stress and Defect Control in GaN Using Low Temperature Interlayers", *Japanese Journal of Applied Physics*, vol. 37, Part 2, No. 12B, (Dec. 15, 1998), pp. L1540-L1542.

Baker, Troy J., et al., "Characterization of Planar Semipolar Gallium Nitride Films on Spinel Substrates", *Japanese Journal of Applied Physics*, vol. 44, No. 29, (2005), pp. L 920-L 922.

Chakraborty, Arpan, et al., "Demonstration of Nonpolar m-Plane InGaN/GaN Light Emitting Diodes on Free-Standing m-Plane GaN Substrates", *Japanese Journal of Applied Physics*, vol. 44, No. 5, (2005), pp. L173-L175.

Chakraborty, Arpan, et al., "Nonpolar InGaN/GaN emitters on reduced-defect lateral epitaxially overgrown a-plane GaN with drive-current-independent electroluminescence emission peak", *Applied Physics Letters*, vol. 85, No. 22,(Nov. 29, 2004), pp. 5143-5145.

Chen, Changqing, et al., "A New Selective Area Lateral Epitaxy Approach for Depositing a-Plane GaN over r-Plane Sapphire", *Japanese Journal of Applied Physics*, vol. 42, Part 2, No. 7B, (Jul. 15, 2003), pp. L818-L820.

Chitnis, Ashay, et al., "Visible light-emitting diodes using a-plane GaN-InGaN multiple quantum wells over r-plane sapphire", *Applied Physics Letters*, vol. 84, No. 18, (May 3, 2004), pp. 3663-3665.

Craven, Michael D., et al., "Characterization of a-Plane GaN/(Al,Ga)N Multiple Quantum Wells Grown via Metalorganic Chemical Vapor Deposition", *Japanese Journal of Applied Physics*, vol. 42, Part 2, No. 3A, (Mar. 1, 2003), pp. L235-L238.

Craven, M. D., et al., "Structural characterization of nonpolar (1120) a-plane GaN thin films grown on (1102) r-plane sapphire", *Applied Physics Letters*, vol. 81, No. 3, (Jul. 15, 2002), pp. 469-471

Craven, M. D., et al., "Threading dislocation reduction via laterally overgrown nonpolar (1120) a-plane GaN", *Applied Physics Letters*, vol. 81, No. 7, (Aug. 12, 2002), pp. 1201-1203.

Dovidenko, K., et al., "Characteristics of stacking faults in AlN thin films" *Journal of Applied Physics*, vol. 82, No. 9, (Nov. 1, 1997), pp. 4296-4299.

Gardner, N. F., et al., "Polarization anisotropy in the electroluminescence of m-plane InGaN-GaN multiple-quantum-well light-emitting diodes", *Applied Physics Letters*, vol. 86, (2005), pp. 111101-1-111101-3.

Grzegory, I., et al., "Seeded growth of GaN at high N2 pressure on (0 0 0 1) polar surfaces of GaN single crystalline substrates", *Materials Science in Semiconductor Processing 4*, (2001), pp. 535-541.

Gu, Shulin, et al., "The impact of initial growth and substrate nitridation on thick GaN growth on sapphire by hydride vapor phase epitaxy", *Journal of Crystal Growth*, vol. 231, (2001), pp. 342-351.

Guhne, T., et al., "Demonstration of semipolar (11-22) InGaN/GaN blue-green light emitting diodes", *Electronics Letters*, vol. 44, No. 3, (Jan. 21, 2008).

Hikosaka, T., et al., "Fabrication and properties of semi-polar (1-101) and (11-12) InGaN/GaN light emitting diodes on patterned Si substrates", *physica status solidi (c)*, vol. 5, No. 6, (2008), pp. 2234-2237.

Iwaya, Motoaki, et al., "Reduction of Etch Pit Density in Organometallic Vapor Phase Epitaxy-Grown GaN on Sapphire by Insertion of a Low-Temperature-Deposited Buffer Layer between High-Temperature-Grown GaN", *Japanese Journal of Applied Physics*, vol. 37, Part 2, No. 3B, (Mar. 15, 1998), pp. L316-L318.

Kuokstis, E., et al., "Polarization effects in photoluminescence of C- and M-plane GaN/AlGaN multiple quantum wells", *Applied Physics Letters*, vol. 81, No. 22, (Nov. 25, 2002), pp. 4130-4132.

(56) References Cited

OTHER PUBLICATIONS

Maruska, H. P., et al., "Development of 50 mm Diameter Non-Polar Gallium Nitride Substrates for Device Applications", *IEEE International Conference on Indium Phosphide and Related Materials*, (May 12-16, 2003), pp. 567-570.

Matsuoka, T, et al., "GaN Growth on Novel Lattice-Matching Substrate: Tilted M-Plane Sapphire", *phys. stat. sol. (a) 188*, No. 2, (2001), pp. 485-489.

Metzger, TH., et al., "X-Ray Diffraction Study of Gallium Nitride Grown by MOCVD", *physica status solidi (b)*, vol. 193, Issue 2, (Feb. 1, 1996), pp. 391-397.

Moe, Craig G., et al., "Milliwatt Power Deep Ultraviolet Light Emitting Diodes Grown on Silicon Carbide", *Japanese Journal of Applied Physics*, vol. 44, No. 17, (Apr. 8, 2005), pp. L502-L504.

NG, H. M., "Molecular-beam epitaxy of GaN/$Al_xGa_{1-x}$N multiple quantum wells on R-plane (1012) sapphire substrates", *Applied Physics Letters*, vol. 80, No. 23, (Jun. 10, 2002), pp. 4369-4371.

Ohba, Y., et al., "A study on strong memory effects for Mg doping in GaN metalorganic chemical vapor deposition", *Journal of Crystal Growth*, vol. 145, (1994), pp. 214-218.

Sano, Masatoshi, et al., "Epitaxial Growth of Undoped and Mg-Doped GaN", *Japanese Journal of Applied Physics*, vol. 15, No. 10, Oct. 1976, pp. 1943-1950.

Sharma, R., et al., "Demonstration of a semipolar (1013) InGaN/GaN green light emitting diode", *Applied Physics Letters*, vol. 87, (2005), 231110-1 to 231110-3.

Sun, Chien-Jen, et al., "Comparison of the physical properties of GaN thin films deposited on (0001) and (0112) sapphire substrates", *Applied Physics Letters*, vol. 63, No. 7, (Aug. 16, 1993), pp. 973-975

Sun, Yue J., et al., "In surface segregation in M-plane (In,Ga)N/GaN multiple quantum well structures", *Applied Physics Letters*, vol.83, No. 25, (Dec. 22, 2003), pp. 5178-5180.

"Brief Communication re Oral Proceedings dated Dec. 11, 2012, European Patent Application No. 09790542.6".

"Communication pursuant to Article 94(3) EPC dated Dec. 15, 2011, European Patent Application No. 09790542.6".

"Communication pursuant to Article 94(3) EPC dated Jul. 22, 2011, European Patent Application No. 09790542.6".

"Communication pursuant to Rules 161(1) and 162 EPC dated Mar. 1, 2011, European Patent Application No. 09790542.6".

"Communication under Rule 71(3) EPC dated Dec. 19, 2012, European Patent Application No. 09790542.6".

"International Search Report and Written Opinion of the International Searching Authority Dated Jan. 7, 2010", *International Application No. PCT/US2009/050867*.

"Office Action Dated Nov. 27, 2012, U.S. Appl. No. 12/503,656".

"Office Action Dated Sep. 24, 2012, Chinese Patent Application No. 200980127776.7".

"Summons to attend oral proceedings pursuant to Rule 115(1) EPC dated Jul. 26, 2012, European Patent Application No. 09790542.6".

Aujol, E., et al., "Thermodynamical and kinetic study of the GaN growth by HVPE under nitrogen", *Journal of Crystal Growth*, 222, (2001), pp. 538-548.

Tsvetkov, D., et al., "Growth of Submicron AIGaN/GaN/AIGaN Heterostructures by Hydride Vapor Phase Epitaxy (HVPE)", *phys. stat. sol. (a)*, vol. 188, No. 1 (2001), pp. 429-432.

"Office Action Dated Aug. 12, 2013; U.S. Appl. No. 12/503,656".

"Office Action Dated Jun. 19, 2013; Chinese Patent Application No. 200980127776.7".

"Office Action Dated Jun. 7, 2013, U.S. Appl. No. 12/503,656".

"Notice of Allowance Dated Oct. 21, 2013; U.S. Appl. No. 12/503,656", (Oct. 21, 2013).

"Office Action Dated Sep. 10, 2013; Japanese Patent Application No. 2011-518917", (Sep. 10, 2013).

\* cited by examiner

GROWTH OF PLANAR NON-POLAR {10-10} M-PLANE GALLIUM NITRIDE WITH HYDRIDE VAPOR PHASE EPITAXY (HVPE)

BACKGROUND OF THE INVENTION

1. Field of the Invention

The present invention relates to the growth of planar non-polar {10-10} gallium nitride (GaN) with hydride vapor phase epitaxy (HVPE).

2. Prior Art

Gallium nitride (GaN) and its related compounds are prime candidates for fabrication of advanced visible and ultraviolet high-power and high-performance optoelectronic devices and electronic devices. These devices are typically grown epitaxially by growth techniques including molecular beam epitaxy (MBE), metalorganic chemical vapor deposition (MOCVD), or hydride vapor phase epitaxy (HVPE).

The selection of substrate is critical for achieving the desired GaN growth orientation. Some of the most widely used substrates for III-N growth include SiC, $Al_2O_3$, and $LiAlO_2$. Various crystallographic orientations of these substrates are commercially available.

Figure 1A:
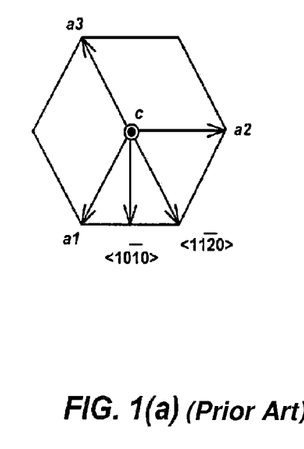
FIGS. 1(a) and 1(b) are schematics of crystallographic directions and planes of interest in hexagonal GaN.
Figure 1B:
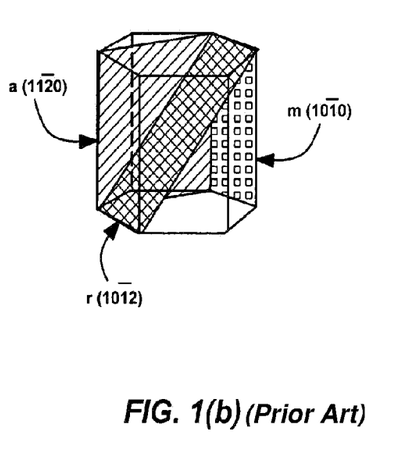

FIGS. 1(a) and 1(b) are schematics of crystallographic directions and planes of interest in crystal cell of hexagonal wurtzite GaN. Specifically, these schematics show the different crystallographic growth directions and also the planes of interest in the hexagonal wurtzite GaN structure, wherein FIG. 1(a) shows the crystallographic directions a1, a2, a3, c, <10-10> and <11-20>, and FIG. 1(b) shows planes a (11-20), m (10-10) and r (10-12). The fill patterns of FIG. 1(b) are intended to illustrate the planes of interest, but do not represent the materials of the structure.

It is relatively easy to grow planar c-plane GaN due to its large growth stability window. Therefore, nearly all current GaN-based devices are grown parallel to the polar c-plane. However, as a result of c-plane growth, each material layer suffers from separation of electrons and holes to opposite faces of the layers due to spontaneous polarization. Furthermore, strain at the interfaces between adjacent layers gives rise to piezoelectric polarization, causing further charge separation.

Figure 2A:
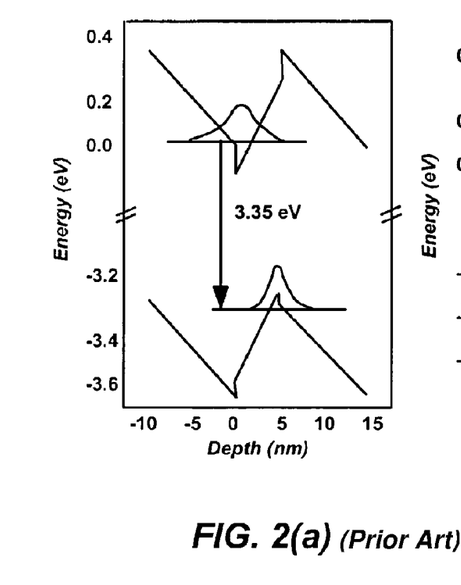
FIGS. 2(a) and 2(b) are schematics of band bending and electron hole separation as a result of polarization.
Figure 2B:
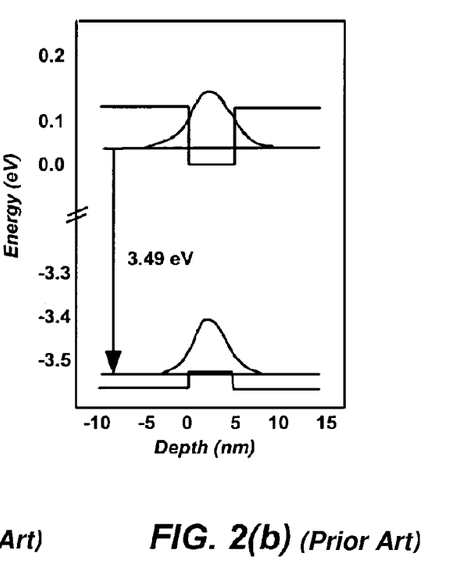

FIGS. 2(a) and 2(b), which are schematics of band bending and electron hole separation in a quantum well placed between two barriers as a result of polarization, show this effect, wherein FIG. 2(a) is a graph of energy (eV) vs. depth (um) and represents a c-plane quantum well, while FIG. 2(b) is a graph of energy (eV) vs. depth (um) and represents a non-polar quantum well.

Such polarization effects decrease the likelihood of electrons and holes recombining, causing the final device to perform poorly. One possible approach for minimizing or eliminating piezoelectric polarization effects in GaN optoelectronic devices is to grow the devices on semi-polar planes of the crystal such as [11-22] plane or non-polar planes of the crystal such as a-{11-20} and m-{10-10} planes family of GaN. Such planes contain equal numbers of Ga and N atoms and are charge-neutral.

Planar {10-10} m-plane GaN growth has been developed by HVPE and MBE methods successfully on m-plane GaN substrates and on (100) γ-$LiAlO_2$ [See "Microstructure and Enhanced Morphology of Planar Nonpolar m-Plane GaN Grown by Hydride Vapor Phase Epitaxy", Benjamin A. Haskell et al.]. GaN layers have been grown on m-plane sapphire by metal organic vapor phase epitaxy using low-temperature AlN nucleation layers. [See "M-plane GaN grown on m-sapphire by metalorganic vapor phase epitaxy", R. Armitage et al.]. Also thick nonpolar {10-10} GaN layers were grown on m-plane sapphire substrates by hydride vapor phase epitaxy (HVPE) using magnetron sputtered ZnO buffers, while semipolar {10-13} GaN layers were obtained by the conventional two-step growth method using the same substrate [See "Microstructure and Optical Properties of Nonpolar m-Plane GaN Films Grown on m-Plane Sapphire by Hydride Vapor Phase Epitaxy", Tongbo Wei et al.]. M-plane GaN epilayers have been directly grown on m-plane sapphire substrates by hydride vapor phase epitaxy using a low temperature GaN nucleation layer [See "M-Plane GaN Grown on m-Plane Sapphire by Hydride Vapor Phase Epitaxy", Tiankai Zhu et al.]. Also known is a self separated GaN layer grown by HVPE at low-temperature (LT) on a buffer layer of $GaN/Al_4C_3$ structure deposited on the sapphire substrate by metalorganic chemical vapor deposition MOCVD. [See "Effect of aluminum carbide buffer layer on growth and self-separation of m-plane GaN by hydride vapor phase epitaxy", Hitoshi Sasaki et al.].

However, prior to the invention described herein, non-polar GaN growth on Sapphire had not been accomplished with HVPE utilizing a low temperature Al Containing Buffer Layer.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

The general purpose of the present invention is to grow planar non-polar {10-10} m-plane GaN material using HVPE. The method includes in-situ pretreatment of the substrate at elevated temperatures in the ambient of ammonia and argon, growing an intermediate layer such as an aluminum nitride (AlN) or aluminum-gallium nitride (AlGaN) or gallium nitride (GaN) on the annealed substrate at a lower temperature, and growing the non-polar m-plane III-Nitride epitaxial layer on the intermediate layer at a higher temperature using HVPE.

The present invention takes advantage of the non-polar nature of m-plane GaN to greatly reduce polarization fields, and gives raise to flexibility in growth variables, such as temperature, pressure and precursor flows, utilizing the advantage of non-polar-GaN stability during growth.

In the following description of the preferred embodiment, reference is made to the accompanying drawings that form a part hereof, and in which is shown by way of illustration a specific embodiment in which the invention may be practiced.

Overview

[0001] The growth of (Ga, In, Al, B) N materials in the polar c-direction causes lower performance in optical devices due to polarization fields causing charge separation along the primary conduction direction. Therefore, recent research has been conducted focusing on semi-polar and non-polar direction growth along a-[11-20] and m-[10-10] directions of these materials to eliminate such effects and so to improve the device performance significantly. Both a-plane and m-plane growth of GaN has been explored by HVPE and MBE, but only successfully on m-plane GaN substrates, which are very small and very expensive. For m-plane and semi-polar growth, large area substrate availability has been a problem. With the emergence of commercially obtainable m-Sapphire substrates, which are stable during HVPE growth, the current invention was made possible. The present invention is the first ever successful growth of non-polar {10-10} m-plane GaN on m-Sapphire by HVPE.

Technical Description

The m-plane Sapphire substrate is cleaned and annealed in an ambient of hydrogen at temperature $T_1$ (typically ~900° C.) and for a duration $t_1$ (typically ~10-20 minutes) followed by a nitridation step in ammonia ($NH_3$) at temperature $T_2$ (typically ~600° C.) for a duration $t_2$ (typically 3-10 minutes).

Prior to growth, a nucleation layer is formed at low temperature $T_3$ (typically ~600° C.) for a short duration $t_3$ (typically ~30 seconds) to achieve a thickness $\delta_3$ (~30 nm). The low temperature nucleation layer can consist of gallium nitride (GaN) or aluminum nitride (AlN) or aluminum gallium nitride (AlGaN), and is followed by a recrystallization step consisting of annealing in an ambient of ammonia and hydrogen ($NH_3+H_2$) where the temperature is rapidly increased by $\Delta T$ (typically 15° C. per minute for 30 minutes). Finally, a GaN layer is grown by HVPE at high temperature $T_5$ (typically ~1040° C.) for a duration $t_5$ depending on the targeted thickness. FIG. 1(a) and FIG. 1(b) illustrate the non-polar m-plane GaN (1-100) crystal plane of interest in the wurtzite crystal configuration.

The growth of non-polar m-plane GaN was performed at atmospheric pressure. The optimum sapphire substrate pre-treatment consists of a thermal cleaning in hydrogen ($H_2$) at about 900° C. for 10-20 minutes followed by annealing in ammonia ($NH_3$) at about 600° C. for 3-10 minutes. A key to achieving non-polar m-plane GaN growth is the formation of a thin (~30 nm) nucleation layer at a low temperature of 600° C. followed by a recrystallization step in an ambient of ammonia and hydrogen (NH3+H2) with a 1:1 ratio where the temperature is increased by about 15° C. per minute over approximately 30 minutes. This step is then followed by the growth of non-polar m-plane GaN, performed at atmospheric pressure at a temperature of about 1040° C.

Figure 4:
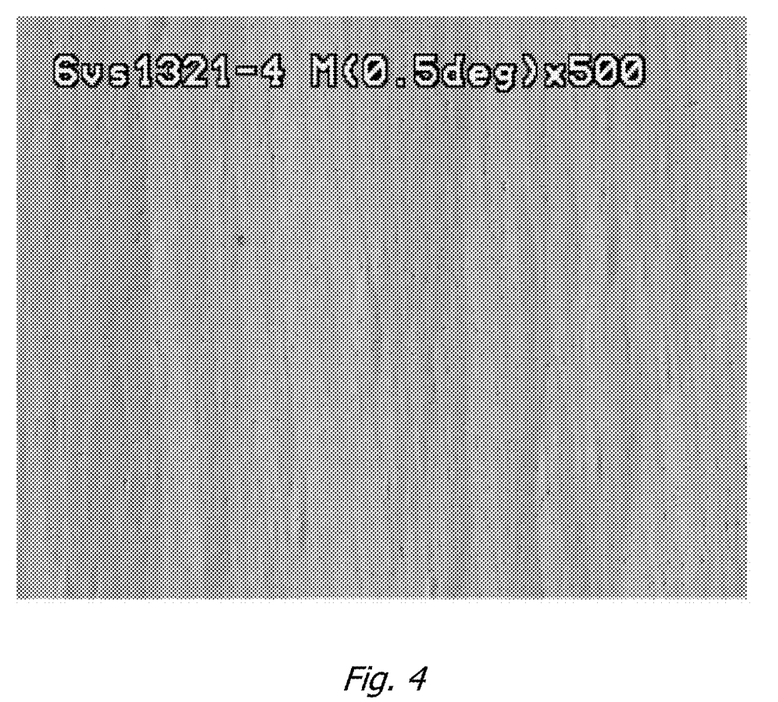
FIG. 4 is an optical micrograph of the surface morphology of the grown m-plane GaN layer. Surface features defining linear like morphological patterns are typical for as grown m-plane GaN surface independent of the growth method.

FIG. 4 is an optical micrograph of the surface morphology of the grown m-plane GaN layer. The image width is 120 µm. Surface features defining linear like morphological patterns are typical for as grown m-plane GaN surface independent of the growth method.

Figure 5:
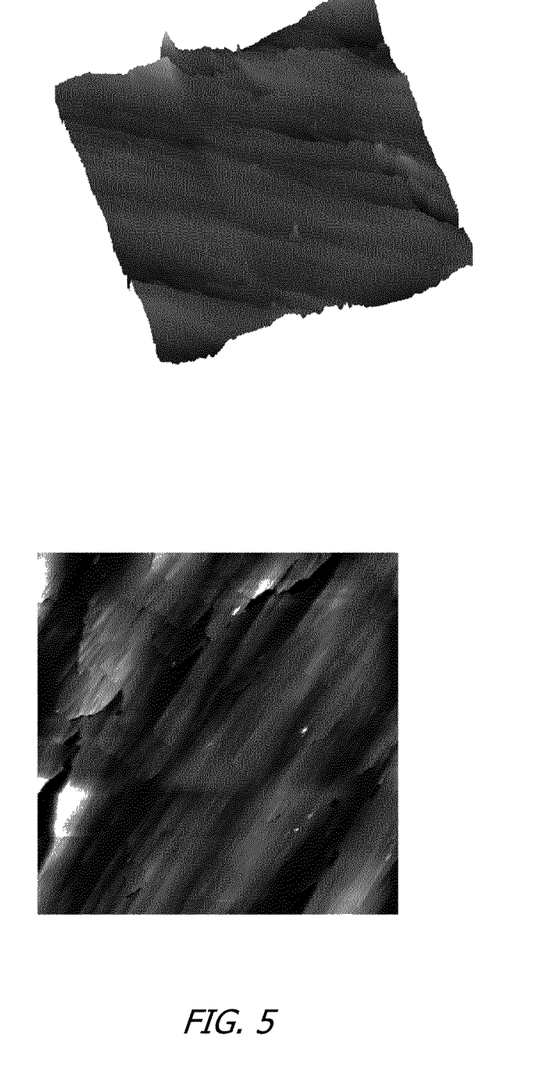
FIG. 5 is an atomic force microscopy (AFM) surface image with an rms surface roughness of 8.38 nm.

A 10 µm×10 µm atomic force microscopy (AFM) surface image of the resulting non-polar GaN material is shown in FIG. 5. The AFM 10 µm×10 µm scan images are of a 7 µm thick (10.0) GaN layer grown on mplane sapphire substrate. The surface roughness value (root mean square) is 8.38 nm. The X-ray rocking curve FWHM measured in this sample is 971 arc sec.

Figure 3:
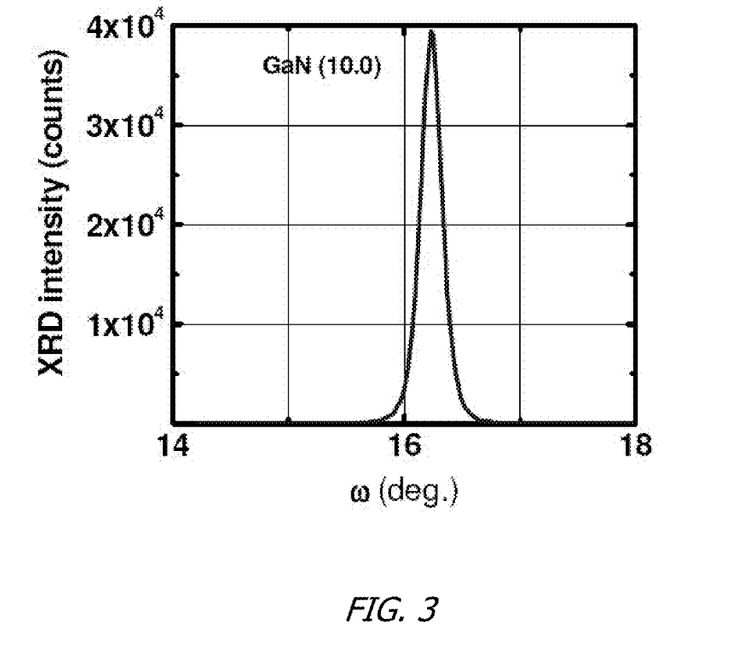
FIG. 3 provides a structural characterization by means of X-ray diffraction of non-polar planar m-plane GaN on m-plane sapphire.

FIG. 3 shows the X-ray ω-scan rocking curve of symmetric (10.0) reflex measured in 15 µm thick (10.0) GaN layer grown on 2-inch diameter m-plane sapphire substrate. The rocking curve full width at half maximum (FWHM) is 808 arc sec.

Process Steps

Figure 6:
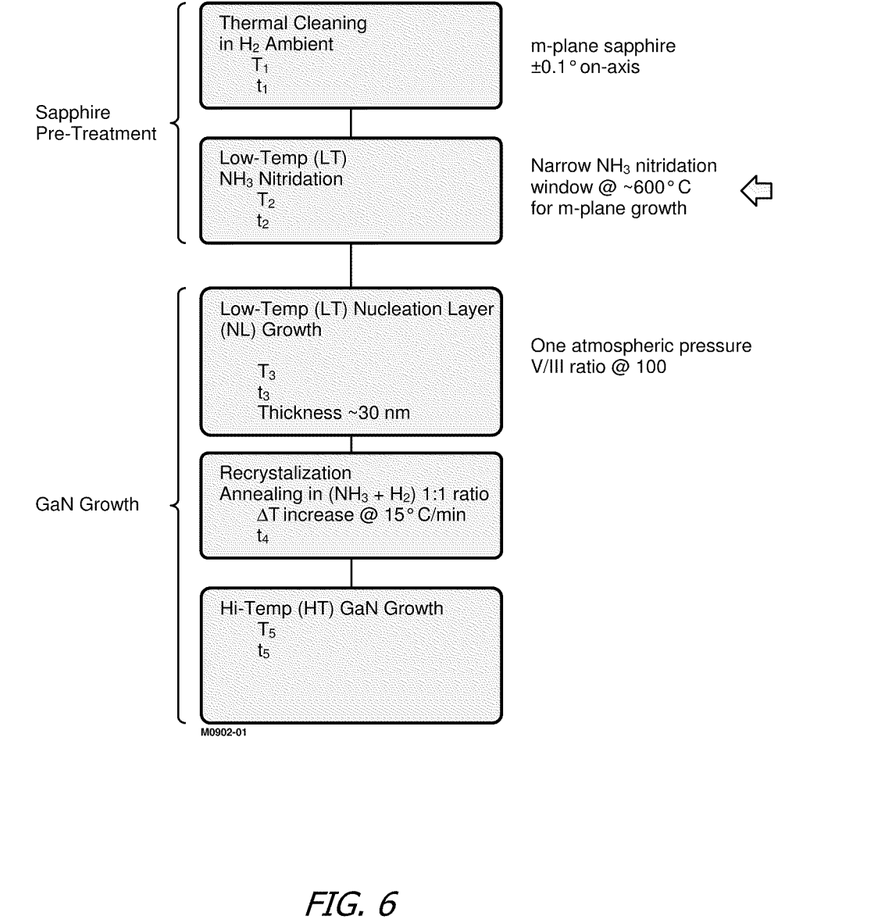
FIG. 6 is a flowchart that illustrates the processing steps for growing planar non-polar III-Nitrides using HVPE according to the preferred embodiment of the present invention.

FIG. 6 is a flowchart that illustrates the foregoing processing steps for growing a planar non-polar III-Nitride epitaxial film using HVPE according to the preferred embodiment of the present invention, wherein the planar non-polar III-Nitride epitaxial film may comprise a planar non-polar m-plane {10-10} GaN epitaxial layer.

Possible Modifications and Variations

Although the preferred embodiment describes the HVPE growth of non-polar GaN on m-Sapphire using an AlN or AlGaN interlayer, alternative suitable substrates, on which the non-polar m-plane III-Nitride epitaxial film could be formed, include, but are not limited to, 6H or 4H m-plane SiC, freestanding m-GaN, $LiGaO_2$ and $LiAlO_2$.

Prior to growth, the suitable substrate can be treated in many different ways in-situ or ex-situ, or it may not be treated at all.

The non-polar epitaxial film can be nucleated and grown over different nucleation layers, such as GaN or AlN, or AlGaN grown under various conditions and by various methods, or over a bare substrate.

The epitaxial film can be any non-polar m-plane III-Nitride material including, but not limited to, GaN, AlN, AlGaN and InGaN with various thicknesses.

The growth parameters required for the growth of non-polar m-plane III-Nitride material may vary from reactor to reactor.

Finally, it is understood that processing steps may be omitted, added or rearranged as desired.

Such variations do not fundamentally alter the general practice of this invention.

Advantages and Improvements

The growth of non-polar {10-10} m-plane GaN has been successfully demonstrated by HVPE and MBE but only successfully on m-plane GaN substrates. However, the present invention is the first-ever successful demonstration of high-quality planar non-polar {10-10} m-plane GaN growth by HVPE utilizing a low temperature Al Containing Buffer Layer.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching, such as additional adjustments to the process described herein, without fundamentally deviating from the essence of the present invention. It is intended that the scope of the invention be limited not by this detailed description, but rather by the claims appended hereto.

What is claimed is:

1. A method of growing a planar non-polar Gallium-Nitride epitaxial film, comprising:
   providing an m-plane sapphire substrate;
   cleaning and annealing the m-plane sapphire substrate in a hydrogen environment at a temperature of approximately 900° C. for a duration of approximately 10 to 20 minutes;

nitridizing the annealed m-plane sapphire substrate in an ammonia environment at a temperature of approximately 600° C. for approximately 3 to 10 minutes;

growing an intermediate layer of Aluminum Nitride (AlN) or Aluminum Gallium Nitride (AlGaN) at a temperature of approximately 600° C. on the nitridized and annealed m-plane sapphire substrate for approximately 30 seconds;

increasing the temperature in an atmosphere of ammonia and hydrogen by approximately 15° C. per minute for 30 minutes to effect the recrystallization of the intermediate layer; and growing non-polar m-plane Gallium-Nitride on the intermediate layer at a temperature of approximately 1040° C. using hydride vapor phase epitaxy (HVPE).

* * * * *